United States Patent
Yu et al.

(10) Patent No.: US 8,136,232 B1
(45) Date of Patent: Mar. 20, 2012

(54) ASSEMBLY FIXTURE

(75) Inventors: Zhong-Yuan Yu, Jiangsu Province (CN); Ching-Feng Hsieh, Taipei (TW)

(73) Assignee: Askey Computer Corp. (TW)

( * ) Notice: Subject to any disclaimer, the term of this patent is extended or adjusted under 35 U.S.C. 154(b) by 0 days.

(21) Appl. No.: 12/955,122

(22) Filed: Nov. 29, 2010

(30) Foreign Application Priority Data

Oct. 15, 2010 (TW) .................. 99219949 U

(51) Int. Cl.
*H05K 3/30* (2006.01)
(52) U.S. Cl. .................. 29/739; 29/729; 29/760
(58) Field of Classification Search .......... 29/760, 29/729, 739
See application file for complete search history.

(56) References Cited

U.S. PATENT DOCUMENTS

| | | | |
|---|---|---|---|
| 6,264,187 B1 * | 7/2001 | Hertz et al. | 269/266 |
| 7,367,252 B2 * | 5/2008 | Tripard | 83/467.1 |

* cited by examiner

*Primary Examiner* — Livius R Cazan
(74) *Attorney, Agent, or Firm* — Schmeiser, Olsen & Watts, LLP

(57) ABSTRACT

An assembly fixture for fixing a part/component to a printed circuit board includes a platform, an elevating unit, and a carrying body. The platform has a receiving area and a plurality of positioning pillars. The elevating unit is disposed on the platform. The carrying body is coupled with the elevating unit, configured to correspond in position to the receiving area, configured to carry the printed circuit board, and provided therein with a plurality of through holes corresponding in position to the positioning pillars, respectively. The elevating unit is capable of descending to enable the positioning pillars to protrude from the printed circuit board and the through holes, respectively, for positioning the part/component on the printed circuit board. The assembly fixture is effective in positioning the part/component on the printed circuit board to render an assembly process of the printed circuit board easy, quick, safe, and precise.

6 Claims, 4 Drawing Sheets

ASSEMBLY FIXTURE

CROSS-REFERENCE TO RELATED APPLICATION

This non-provisional application claims priority under 35 U.S.C. §119(a) on Patent Application No(s). 099219949 filed in Taiwan, R.O.C. on Oct. 15, 2010, the entire contents of which are hereby incorporated by reference.

FIELD OF THE TECHNOLOGY

The present invention relates to assembly fixtures, and more particularly, to an assembly fixture for assembling a part/component to a printed circuit board.

BACKGROUND

As disclosed in the prior art, to manually mount an additional part/component on a printed circuit board which is already mounted thereon with existing electronic components, it is feasible to mount the additional part/component on the printed circuit board, provided that a plurality of positioning holes are already formed on the printed circuit board. In other words, the additional part/component can be assembled to the printed circuit board by one of the positioning holes thereon. For example, a heat sink (a part/component) can be mounted on a south/north bridge chip (an electronic component). However, electronic components are usually side by side when mounted on a printed circuit board, and positioning holes are usually formed between the electronic components mounted on the printed circuit board. Hence, during a mounting process, a part/component is likely to collide with the electronic components mounted on the printed circuit board and get damaged.

Referring to FIG. 1, for a heat sink 3 equipped with a plurality of push pins 5 to be assembled to a chip 2 mounted on a printed circuit board 1, the prior art discloses that the heat sink 3 is assembled on the printed circuit board 1 by means of the engagement between the push pins 5 of the heat sink 3 and a plurality of positioning holes 4 of the printed circuit board 1, respectively. However, during the aforesaid assembly process, the assembly worker often fails to perform accurate alignment of the push pins 5 with the positioning holes 4 required for the aforesaid precise assembly process, because the positioning holes 4 fall within the shadow of the heat sink 3. The odds are that inaccurate alignment of the push pins 5 with the positioning holes 4 can end up in collision between the heat sink 3 and electronic components 6 on the printed circuit board 1. Another likely consequence of the process of aligning the push pins 5 and the positioning holes 4 is that the assembly worker exerts an inappropriate force upon the printed circuit board 1 and, as a result, the printed circuit board 1 is compressed and damaged.

Therefore, the conventional assembly process inevitably compromises the conforming rate of the mounting of an external part/component on a printed circuit board, as the conventional assembly process does not ensure that the external part/component can be safely mounted on the printed circuit board without causing collision thereto. Furthermore, an inappropriate force applied to the printed circuit board during an assembly process or an assembly process performed inappropriately on the printed circuit board is likely to damage the electronic components or parts/components mounted on the printed circuit board.

SUMMARY

It is an objective of the present invention to provide an assembly fixture for assembling a part/component to a printed circuit board easily, quickly, safely, and precisely.

Another objective of the present invention is to provide an assembly fixture for assembling a part/component to a printed circuit board without causing damage to an electronic component and the part/component on the printed circuit board as a result of a collision therebetween.

Yet another objective of the present invention is to provide an assembly fixture for assembling a part/component to a printed circuit board so as for the part/component to be positioned on the printed circuit board easily and accurately, thereby optimizing the assembly process.

In order to achieve the above and other objectives, the present invention provides an assembly fixture for assembling a part/component to a printed circuit board, comprising: a platform having a receiving area and a plurality of positioning pillars protrudingly disposed on the receiving area; an elevating unit disposed on the platform; and a carrying body coupled to the elevating unit and corresponding in position to the receiving area, configured to carry the printed circuit board, and provided therein with a plurality of through holes corresponding in position to the positioning pillars, respectively, wherein the elevating unit is capable of descending to enable the positioning pillars to protrude from the printed circuit board and the through holes, respectively, for positioning the part/component on the printed circuit board.

Compared with the prior art, the present invention provides an assembly fixture for assembling a part/component to a printed circuit board. The assembly fixture is advantageously characterized in that: the processing of assembling the part/component to the printed circuit board is free from undesired collision therebetween; and the part/component is assembled to the printed circuit board precisely and quickly.

BRIEF DESCRIPTION OF THE DRAWINGS

A detailed description of further features and advantages of the present invention is given below so that a person skilled in the art can understand and implement the technical contents of the present invention and readily comprehend the objectives, features, and advantages thereof by reviewing the disclosure of the present specification and the appended claims in conjunction with the accompanying drawings, in which:

DETAILED DESCRIPTION

Figure 1:
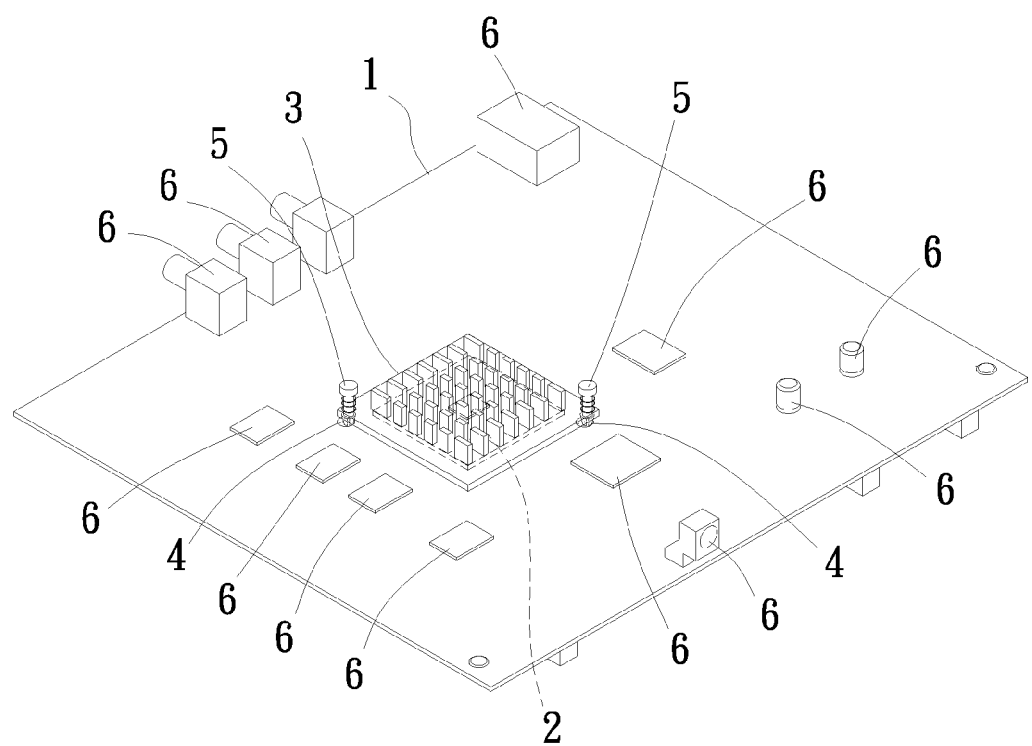
FIG. 1 is a perspective view of a part/component mounted on a printed circuit board in the prior art.
Figure 2:
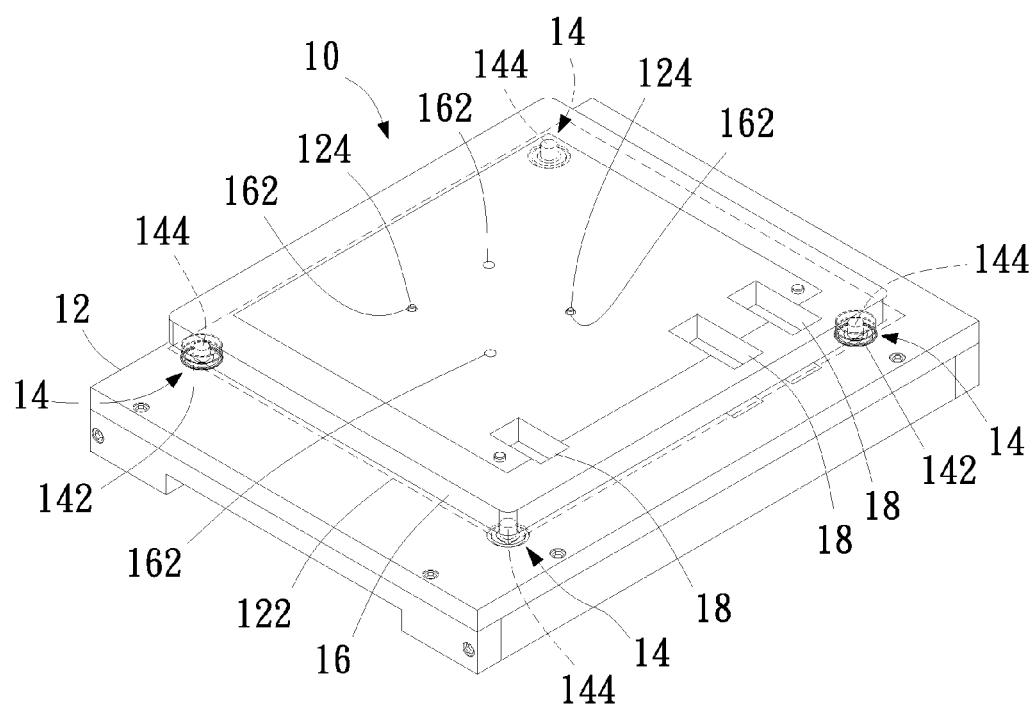
FIG. 2 is a schematic perspective view of an assembly fixture according to a first embodiment of the present invention.

Referring to FIG. 2, there is shown a schematic perspective view of an assembly fixture 10 according to a first embodiment of the present invention. As shown in the drawing, the assembly fixture 10 is configured to assemble an external part/component to a printed circuit board. The assembly fixture 10 comprises a platform 12, an elevating unit 14, and a carrying body 16. The platform 12 has a receiving area 122 and a plurality of positioning pillars 124. The positioning pillars 124 are protrudingly disposed on the receiving area 122. The elevating unit 14 is disposed on the platform 12. The carrying body 16 is coupled to the elevating unit 14 and corresponds in position to the receiving area 122. The carrying body 16 is provided therein with a plurality of through holes 162 corresponding in position to the positioning pillars 124, respectively. The elevating unit 14 is capable of descending to enable the positioning pillars 124 to protrude from the printed circuit board and the through holes 162, respectively, for positioning an external part/component on the printed circuit board. The elevating unit 14 is configured to change the distance between the platform 12 and the carrying body 16. For example, a decrease in the distance between the platform 12 and the carrying body 16 causes the positioning pillars 124 to protrude from the through holes 162, respectively. Conversely, an increase in the distance between the platform 12 and the carrying body 16 allows the positioning pillars 124 to protrude slightly, or prevents the positioning pillars 124 from protruding from the through holes 162, respectively.

In this embodiment, the elevating unit 14 is further illustrated with a plurality of resilient elements 142 and a plurality of supporting pillars 144. The supporting pillars 144 support from beneath the carrying body 16 disposed on the platform 12. The carrying body 16 may slide along the supporting pillars 144 to effectuate elevation of the carrying body 16. The resilient elements 142 are disposed around the supporting pillars 144, respectively, and disposed between the carrying body 16 and the platform 12. Once the carrying body 16 is pressed to descend, the resilient elements 142 will be compressed to thereby exert a resilient restoring force upon the carrying body 16. Once the carrying body 16 is no longer pressed downward, the carrying body 16 ascends and returns to its original position under the resilient restoring force.

In another embodiment, the supporting pillars 144 are capable of segmental adjustment of position. The supporting pillars 144 adjust the distance between the platform 12 and the carrying body 16 according to the thickness of printed circuit boards. By segmental adjustment, the supporting pillars determine the position of the gap between the platform 12 and the carrying body 16 to thereby determine the extent of the protrusion of the positioning pillars 124 from the through holes 162, respectively.

In the first embodiment, the resilient elements 142 are selectively disposed around at least one of the supporting pillars 144 in order to cut costs. Alternatively, the resilient elements 142 are disposed around a portion of the supporting pillars 144, respectively. Alternatively, the resilient elements 142 are disposed around the diagonal ones of the supporting pillars 144. The arrangement—not every one of the supporting pillars 144 is enclosed by a corresponding one of the resilient elements 142, and at least one of the supporting pillars 144 is not fully enclosed by a corresponding one of the resilient elements 142—is as efficient as having each of the supporting pillars 144 fully enclosed by a corresponding one of the resilient elements 142.

Furthermore, the carrying body 16 has a plurality of openings 18. The openings 18 receive a plurality of electronic components disposed on a printed circuit board, respectively, when the printed circuit board is mounted on the carrying body 16. As a result, the printed circuit board lies flatly on the carrying body 16 to allow an additional part/component to be assembled to the printed circuit board. The openings 18 correspond in position to the electronic components of the printed circuit board, respectively.

Figure 3:
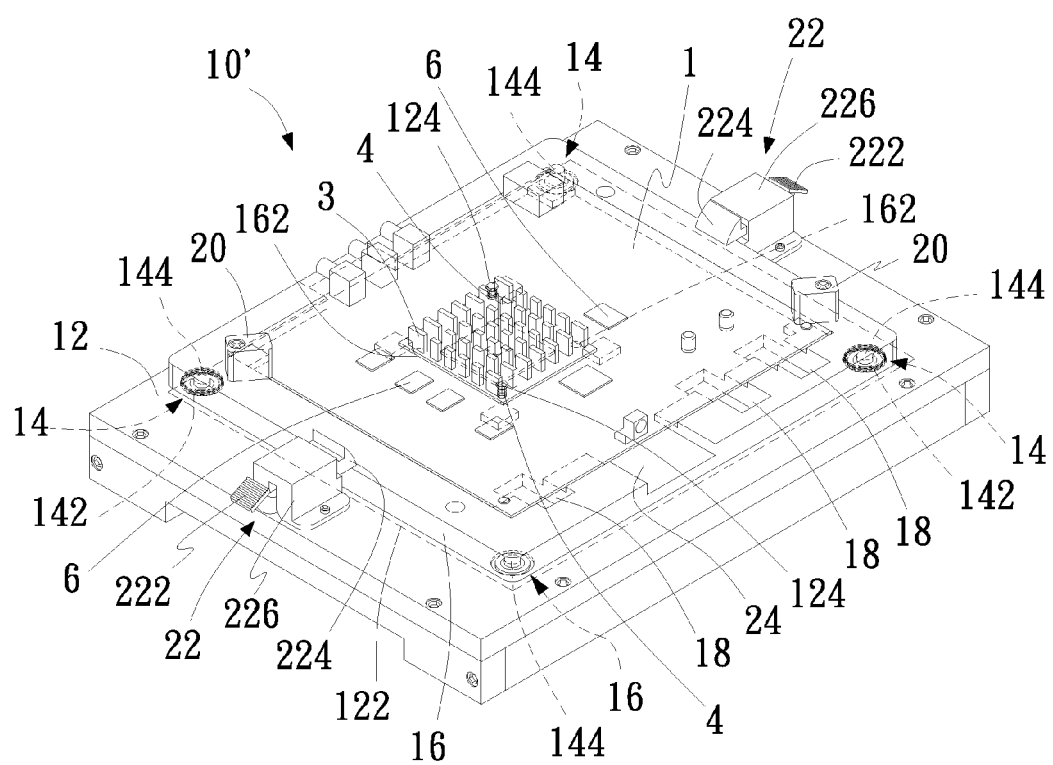
FIG. 3 is a schematic perspective view of an assembly fixture according to a second embodiment of the present invention.

Referring to FIG. 3, there is shown a schematic perspective view of an assembly fixture 10' according to a second embodiment of the present invention. As shown in the drawing, the assembly fixture 10' is configured to assemble a part/component to a printed circuit board 1. In this embodiment, the part/component is exemplified by the heat sink 3. The heat sink 3 has the plurality of push pins 5. The printed circuit board 1 has a plurality of positioning holes 4 and electronic components 6. The assembly fixture 10' not only comprises the platform 12, the elevating unit 14, and the carrying body 16 disclosed in the first embodiment, but also comprises a clamping unit 20. The clamping unit 20 is disposed on the carrying body 16 and configured to fix the printed circuit board 1 to the carrying body 16 firmly and thereby prevent the printed circuit board 1 from vibrating relative to the carrying body 16 or even shifting away from the carrying body 16.

The assembly fixture 10' further comprises a fixing unit 22. The fixing unit 22 is disposed on the platform 12 and configured to keep the status of the carrying body 16 after the descent thereof. For example, in this embodiment, the fixing unit 22 comprises a pressing-pulling bar 222, a moving-driving latch 224, and a body 226. A user may press the pressing-pulling bar 222 to drive the moving-driving latch 224, so as to keep the status of the carrying body 16 after the descent thereof. Please note that the purpose of the fixing unit 22 is to keep the status of the carrying body 16 after the descent thereof.

It is imperative to facilitate the separation of the printed circuit board 1 and the carrying body 16 which might otherwise be hindered by surface tension or for any other related reason. It is also imperative to enable the printed circuit board 1 to be easily disposed on the carrying body 16. To this end, the assembly fixture 10' further comprises a collecting unit 24. In this embodiment, the collecting unit 24 is a groove disposed at the edge of the carrying body 16 and configured to enable the user to put the printed circuit board 1 on the carrying body 16 easily or collect the printed circuit board 1 from the groove at the edge of the carrying body 16, by holding the edge of the carrying body 16.

Figure 4:
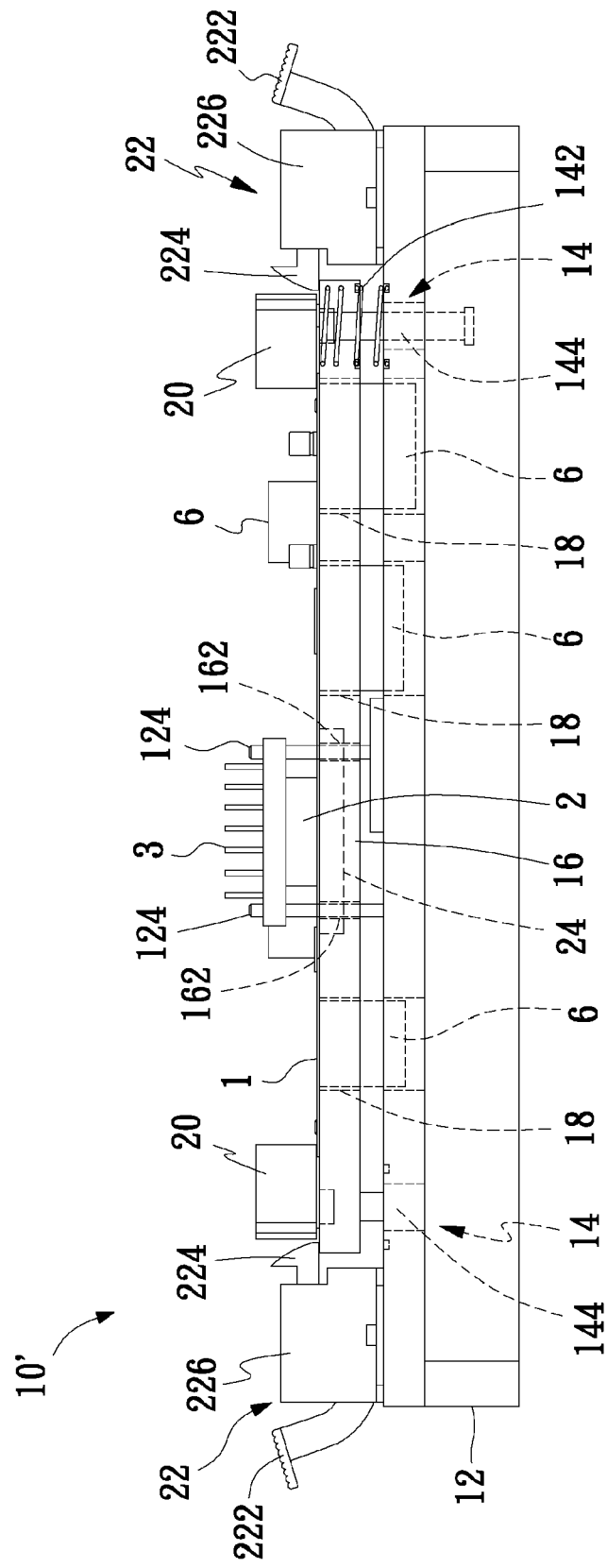
FIG. 4 is a cross-sectional view of the assembly fixture shown in FIG. 3.

Referring to FIG. 4, there is shown a cross-sectional view of the assembly fixture 10' shown in FIG. 3. As regards the assembly fixture 10', the positions of components relative to each other can be revealed by a comparison of FIG. 3 and FIG. 4. As shown in FIG. 4, the printed circuit board 1 is disposed on the carrying body 16, and the carrying body 16 is coupled to the elevating unit 14. The elevating unit 14 is disposed on the platform 12. The positioning pillars 124 are protrudingly disposed on the platform 12.

Furthermore, the carrying body 16 has the through holes 162 and the openings 18. The through holes 162 correspond in position to the positioning pillars 124, respectively. The openings 18 receive the electronic components 6 disposed on the printed circuit board 1, respectively, wherein the electronic components 6 disposed on the printed circuit board 1 face the platform 12. As a result, the printed circuit board 1 lies flatly on the carrying body 16.

As mentioned earlier, the printed circuit board 1 is firmly fixed to the carrying body 16 by means of the clamping unit 20. After the descent of the carrying body 16 toward the platform 12 (when driven by the elevating unit 14), the fixing unit 22 keeps the status of the carrying body 16 after the descent thereof. In this embodiment, the elevating unit 14 is illustrated with the resilient elements 142 and the supporting pillars 144. The collecting unit 24 disposed at the edge of the carrying body 16 enables the user to position or collect the printed circuit board 1 directly.

Please note that the positioning pillars 124 disposed on the receiving area 122 of the platform 12 can protrude from the printed circuit board 1 and the through holes 162 of the carrying body 16, respectively by means of the descending of the elevating unit 14, and are configured to allow the heat sink 3 to be fixed in position. The push pins 5 of the heat sink 3 can be easily and accurately aligned with the printed circuit board 1 and thereby mounted thereon. Hence, the heat sink 3 can be mounted on the printed circuit board 1 easily, quickly, safely, and accurately.

Compared with the prior art, the present invention provides an assembly fixture for assembling an additional part/component on a printed circuit board in a way that is precise and free of collision-induced damage. The assembly fixture of the present invention is advantageously characterized in that: the processing of assembling the part/component to the printed circuit board is free from undesired collision therebetween; and the part/component is assembled to the printed circuit board precisely and quickly.

The foregoing embodiments are provided to illustrate and disclose the technical features of the present invention so as to enable persons skilled in the art to understand the disclosure of the present invention and implement the present invention accordingly. However, the foregoing embodiments are not intended to be restrictive of the scope of the present invention. Hence, all equivalent modifications and substitutions made to the foregoing embodiments without departing from the spirit and principles in the disclosure of the present invention should fall within the scope of the present invention as set forth in the appended claims.

What is claimed is:

1. An assembly fixture for assembling a part/component to a printed circuit board, comprising:
    a platform having a receiving area and a plurality of positioning pillars protrudingly disposed on the receiving area;
    an elevating unit having a plurality of resilient elements and a plurality of supporting pillars, and the resilient elements and the supporting pillars disposed on the platform; and
    a carrying body coupled to the elevating unit and corresponding in position to the receiving area, configured to carry the printed circuit board, and provided therein with a plurality of through holes corresponding in position to the positioning pillars, respectively,
    wherein the elevating unit is capable of compressing to decrease a distance between the platform and the carrying body to enable the positioning pillars to protrude from the printed circuit board and the through holes, respectively, for positioning the part/component on the printed circuit board, and wherein the elevating unit is capable of decompressing to restore the distance between the platform and the carrying body.

2. The assembly fixture of claim 1, wherein the carrying body comprises a plurality of openings for receiving a plurality of electronic components of the printed circuit board.

3. The assembly fixture of claim 1, further comprising a clamping unit disposed on the carrying body and configured to fix the printed circuit board to the carrying body.

4. The assembly fixture of claim 1, further comprising a fixing unit disposed on the platform and configured to keep a status of the carrying body after a descent thereof.

5. The assembly fixture of claim 1, further comprising a collecting unit, which is a groove disposed at an edge of the carrying body and configured to collect the printed circuit board.

6. The assembly fixture of claim 1, wherein the resilient elements are disposed around at least one of the supporting pillars.

* * * * *